(12) United States Patent
Ishibashi

(10) Patent No.: US 9,058,977 B2
(45) Date of Patent: Jun. 16, 2015

(54) SUBSTRATE CLEANING APPARATUS AND SUBSTRATE CLEANING METHOD

(71) Applicant: EBARA CORPORATION, Tokyo (JP)

(72) Inventor: Tomoatsu Ishibashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 14/098,471

(22) Filed: Dec. 5, 2013

(65) Prior Publication Data

US 2014/0158160 A1   Jun. 12, 2014

(30) Foreign Application Priority Data

Dec. 6, 2012 (JP) ................................ 2012-267568
Nov. 18, 2013 (JP) ................................ 2013-238224

(51) Int. Cl.
*H01L 21/02* (2006.01)
*H01L 21/67* (2006.01)

(52) U.S. Cl.
CPC .... *H01L 21/02057* (2013.01); *H01L 21/67046* (2013.01); *H01L 21/67051* (2013.01)

(58) Field of Classification Search
None
See application file for complete search history.

(56) References Cited

U.S. PATENT DOCUMENTS

2007/0226925 A1* 10/2007 Hiraoka et al. ................. 15/102
2011/0189857 A1*  8/2011 Matsuoka et al. ............ 438/692

FOREIGN PATENT DOCUMENTS

| JP | 64-019730 | A |   | 1/1989 |
| JP | 09-162151 | A |   | 6/1997 |
| JP | 10-308374 | A |   | 11/1998 |
| JP | 10-312982 | A |   | 11/1998 |
| JP | 10-312983 | A |   | 11/1998 |
| JP | 2000-015189 | A |   | 1/2000 |
| JP | 2000015189 | A | * | 1/2000 |
| JP | 2000-173966 | A |   | 6/2000 |
| JP | 2002-18368 | A |   | 1/2002 |
| JP | 2003-031536 | A |   | 1/2003 |
| JP | 2006-73788 | A |   | 3/2006 |
| JP | 2006073788 | A | * | 3/2006 |

OTHER PUBLICATIONS

English Machine Translation of JP 2006-073788 A.*
English Machine Translation of JP 2000-015189 A.*

* cited by examiner

*Primary Examiner* — Nicole Blan
(74) *Attorney, Agent, or Firm* — Baker & Hostetler LLP

(57) ABSTRACT

A substrate cleaning apparatus performs scrub cleaning of a surface of a substrate such as a semiconductor wafer. The substrate cleaning apparatus includes a cleaning member having a lower-end contact surface, and a cleaning liquid supply nozzle configured to supply a cleaning liquid to the surface of the substrate. The cleaning member is configured to scrub-clean the surface of the substrate by moving the cleaning member in one direction while the cleaning member is being rotated about its rotational axis and by rubbing the lower-end contact surface of the cleaning member against the surface of the substrate which is being rotated horizontally in the presence of the cleaning liquid. The cleaning member has an inverted truncated-cone shape wherein the angle α between the lower-end contact surface and a straight line on an outer circumferential surface of the cleaning member is larger than 90° and is not more than 150°.

13 Claims, 11 Drawing Sheets

SUBSTRATE CLEANING APPARATUS AND SUBSTRATE CLEANING METHOD

CROSS REFERENCE TO RELATED APPLICATIONS

This document claims priorities to Japanese Patent Application No. 2012-267568 filed Dec. 6, 2012 and Japanese Patent Application No. 2013-238224 filed Nov. 18, 2013, the entire contents of which are hereby incorporated by reference.

BACKGROUND OF THE INVENTION

1. Field of the Invention

The present invention relates to a substrate cleaning apparatus and a substrate cleaning method for performing scrub cleaning of a surface of a substrate such as a semiconductor wafer by bringing a contact surface of a lower end of a vertically extending cylindrical cleaning member (pencil-type cleaning member) into contact with the surface of the substrate that is being rotated in a horizontal plane in the presence of a cleaning liquid and by moving the cleaning member in one direction while the cleaning member is being rotated about its own axis. The substrate cleaning apparatus and the substrate cleaning method of the present invention can deal with a surface of a semiconductor wafer having a large diameter of 450 mm, and can be applied to a manufacturing process of a flat panel, a manufacturing process of an image sensor such as CMOS and CCD, a manufacturing process of a magnetic film for MRAM, and the like.

2. Description of the Related Art

As semiconductor devices are becoming finer these days, cleaning of various films, made of materials having different physical properties and formed on a substrate, is widely practiced. For example, in a damascene interconnect forming process for forming interconnects by filling a metal into interconnect trenches formed in an insulating film on the substrate surface, an extra metal on the substrate surface is polished away by chemical mechanical polishing (CMP) after the formation of damascene interconnects. A plurality of films such as a metal film, a barrier film and an insulating film, having different wettabilities with water, are exposed on the substrate surface after CMP.

Particles (defects) such as a residue of a slurry (slurry residue) that has been used in CMP, and metal polishing debris exist on the substrate surface having the exposed films, such as a metal film, a barrier film and an insulating film, by CMP. If cleaning of the substrate surface is insufficient and the residues remain on the substrate surface, the residues on the substrate surface may cause reliability problems such as the occurrence of leak from a residue portion, and poor adhesion. It is therefore necessary to clean the substrate surface, with a high degree of cleanliness, on which the plurality of films, such as a metal film, a bather film and an insulating film, having different wettabilities with water, are exposed.

There have been proposed various substrate cleaning apparatuses for performing scrub cleaning of a surface of a substrate such as a semiconductor wafer with a vertically extending cleaning member by moving the cleaning member in one direction while the cleaning member is being rotated about its own axis. One proposed substrate cleaning apparatus uses a cleaning member having a tapered region for acting on a surface of a substrate as disclosed in Japanese laid-open patent publication No. 2002-18368. Another proposed substrate cleaning apparatus uses a cleaning member inclined by a certain angle so that only one end portion of the cleaning member in its radial direction is brought into contact with a surface of a substrate as disclosed in Japanese laid-open patent publication No. 2000-15189. Still another proposed substrate cleaning apparatus uses a cleaning member made of natural rubber and having at least a cleaning action surface formed into a flat and smooth surface as disclosed in Japanese laid-open patent publication No. 10-312982. Further, another proposed substrate cleaning apparatus is configured to rotate a substrate and a cleaning member in respective directions that are opposite to each other as disclosed in Japanese laid-open patent publication No. 2006-737788.

In conventional common damascene interconnects, there have been used tungsten as a metal and an oxide film as an insulating film respectively. Tungsten and the oxide film have hydrophilic surface properties, having a contact angle with water of not more than 15 degrees. Recently, in damascene interconnects, there have been increasingly used copper as an interconnect metal and a so-called low-k film, having a low dielectric constant, as an insulating film. Copper and the low-k film after CMP have hydrophobic surface properties, having a contact angle with water of not less than 30 degrees. Therefore, in the case where the substrate surface on which copper and the low-k film are exposed by CMP is cleaned by scrub cleaning with a vertically extending cleaning member (pencil-type cleaning member) in the presence of a cleaning liquid, the wettability non-uniformity of the substrate surface is increased, and thus it is difficult to clean the substrate surface with a high degree of cleanliness.

Particles (defects) such as a slurry residue, remaining on a substrate surface after cleaning, may cause a lowering of the yield of a semiconductor device. Therefore, a strong demand exists for the development of a substrate cleaning apparatus and a substrate cleaning method which can clean a substrate surface with a high degree of cleanliness to reduce the number of defects remaining on the substrate surface even when the substrate surface has a hydrophobic property, such as a substrate surface after CMP in a semiconductor device whose surface condition is hydrophobic.

In the conventional general substrate cleaning apparatus for performing scrub cleaning of a surface of a substrate such as a semiconductor wafer with a vertically extending cleaning member by moving the cleaning member in one direction while the cleaning member is being rotated about its own axis, a contact pressure applied to the surface of the substrate by the cleaning member is changed by deformation of the cleaning member, but no regard is given to such change of the contact pressure. Therefore, it is difficult to clean a substantially entire area of the surface of the substrate with a high degree of cleanliness.

Particularly, a size of a silicon wafer is becoming a maximum diameter of 300 mm to a maximum diameter of 450 mm, and thus it is considered to become more difficult for the substrate cleaning apparatus to clean a substantially entire area of a surface of a large-size substrate, such as a silicon wafer having a diameter of 450 mm.

SUMMARY OF THE INVENTION

The present invention has been made in view of the above circumstances. It is therefore an object of the present invention to provide a substrate cleaning apparatus and a substrate cleaning method which are capable of reducing the number of defects remaining on a surface of a substrate by efficiently cleaning a substantially entire area of the surface of the substrate with a high degree of cleanliness even if the surface of the substrate has a hydrophobic property.

In order to achieve the above object, according to one aspect of the present invention, there is provided a substrate cleaning apparatus for cleaning a surface of a substrate, comprising: a cleaning member having a lower-end contact surface; and a cleaning liquid supply nozzle configured to supply a cleaning liquid to the surface of the substrate; wherein the cleaning member is configured to scrub-clean the surface of the substrate by moving the cleaning member in one direction while the cleaning member is being rotated about a vertically extending rotational axis and by rubbing the lower-end contact surface of the cleaning member against the surface of the substrate which is being rotated in a horizontal plane in the presence of the cleaning liquid; and the cleaning member has an inverted truncated-cone shape wherein the angle α between the lower-end contact surface and a straight line on an outer circumferential surface of the cleaning member is larger than 90° and is not more than 150°.

According to the present invention, when the surface of the substrate is cleaned by rubbing the lower-end contact surface of the cleaning member against the surface of the substrate while moving the cleaning member in one direction, the rotational axis of the cleaning member is inclined. By inclining the rotational axis of the cleaning member, a part of the lower-end contact surface of the cleaning member can be prevented from being lifted off the surface of the substrate even if the deformation amount (deflection amount) of the cleaning member against the surface of the substrate is changed. Thus, the contact pressure of the cleaning member against the surface of the substrate is adjusted to efficiently clean a substantially entire area of the surface of the substrate with a high degree of cleanliness even if the surface of the substrate has a hydrophobic property.

In a preferred aspect of the present invention, the cleaning member is moved in the one direction while the rotational axis of the cleaning member is inclined in the same direction as the moving direction of the cleaning member.

For example, if the cleaning member is moved in a rightward direction, the rotational axis of the cleaning member is inclined rightwards. Thus, the cleaning member is elastically deformed so that the deformation amount (deflection amount) becomes progressively greater along the moving direction of the cleaning member, and the contact pressure of the cleaning member against the surface of the substrate becomes progressively greater along the moving direction of the cleaning member, thereby cleaning the surface of the substrate with the cleaning member.

In a preferred aspect of the present invention, the cleaning member is rotated in a direction opposite to the rotation direction of the substrate.

According to the present invention, the relative rotational speed between the rotational speed of the cleaning member at a portion of the cleaning member which is closer to an outer circumferential area of the substrate and the rotational speed of the substrate is increased relatively to enhance the cleaning effect at the outer circumferential area of the substrate.

In a preferred aspect of the present invention, the cleaning member is moved in the one direction so that the lower-end contact surface of the cleaning member passes over a rotation center of the substrate and the rotational axis of the cleaning member does not pass over the rotation center of the substrate.

According to the present invention, the cleaning member thus moved can reliably clean an area of the substrate including the rotation center of the substrate.

According to another aspect of the present invention, there is provided a substrate cleaning method for cleaning a surface of a substrate, comprising: moving a cleaning member in one direction while the cleaning member is being rotated about a vertically extending rotational axis, and rubbing a lower-end contact surface of the cleaning member against the surface of the substrate which is being rotated in a horizontal plane in the presence of the cleaning liquid, thereby scrub-cleaning the surface of the substrate; wherein the cleaning member has an inverted truncated-cone shape wherein the angle α between the lower-end contact surface and a straight line on an outer circumferential surface of the cleaning member is larger than 90° and is not more than 150°.

According to the present invention, when the surface of the substrate is cleaned by rubbing the lower-end contact surface of the cleaning member against the surface of the substrate while moving the cleaning member in one direction, the rotational axis of the cleaning member is inclined. By inclining the rotational axis of the cleaning member, a part of the lower-end contact surface of the cleaning member can be prevented from being lifted off the surface of the substrate even if the deformation amount (deflection amount) of the cleaning member is changed. Thus, the contact pressure of the cleaning member against the surface of the substrate is adjusted to efficiently clean a substantially entire area of the surface of the substrate with a high degree of cleanliness and to reduce the number of defects that remain on the surface of the substrate even if the surface of the substrate has a hydrophobic property.

DETAILED DESCRIPTION

A substrate cleaning apparatus and a substrate cleaning method according to embodiments of the present invention will be described below with reference to the drawings.

Figure 1:
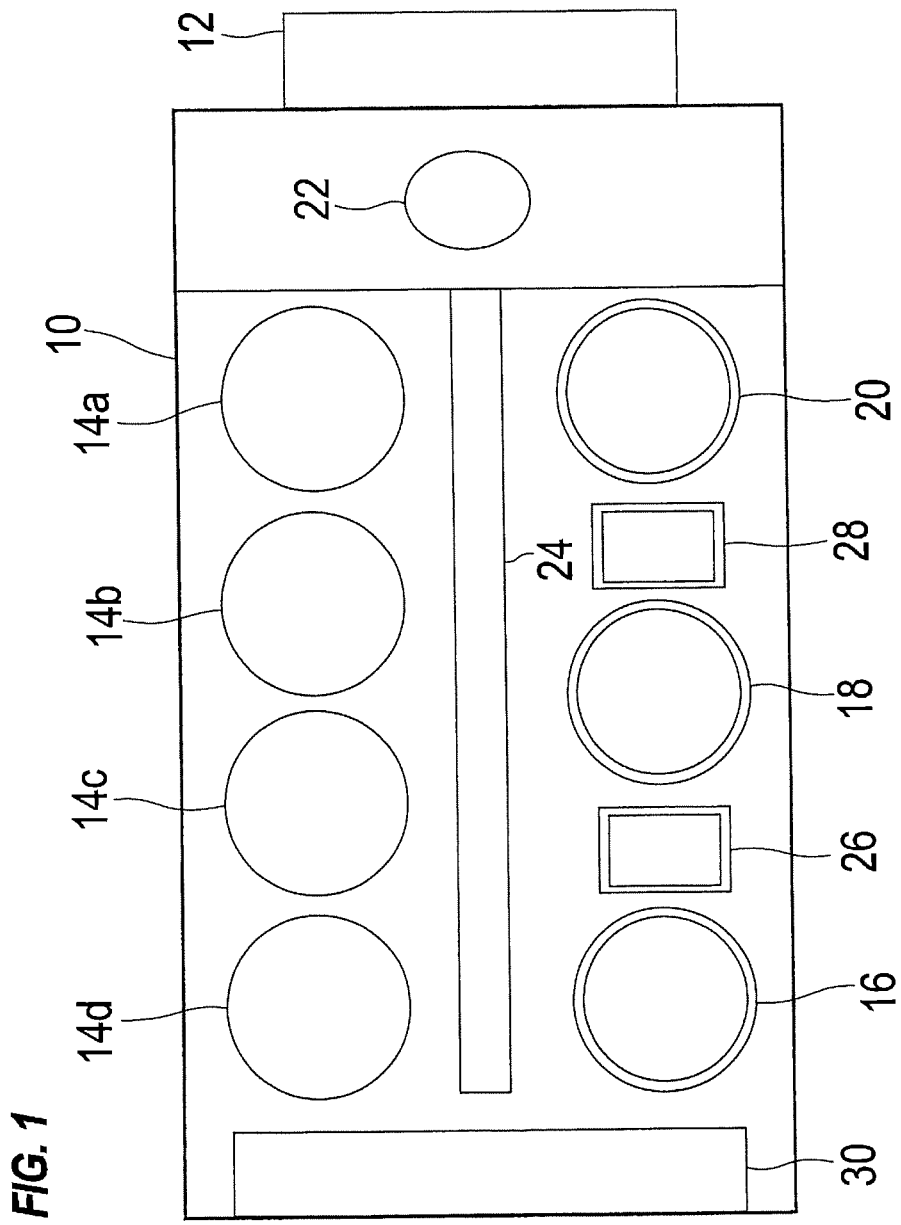
FIG. 1 is a plan view showing an entire structure of a substrate processing apparatus incorporating a substrate cleaning apparatus according to an embodiment of the present invention.

FIG. 1 is a plan view showing an entire structure of a substrate processing apparatus incorporating a substrate cleaning apparatus according to an embodiment of the present invention. As shown in FIG. 1, the substrate processing apparatus includes a generally-rectangular housing 10, and a loading port 12 for placing thereon a substrate cassette storing a large number of substrates, such as semiconductor wafers. The loading port 12 is disposed adjacent to the housing 10 and is capable of placing thereon an open cassette, a SMIF (standard manufacturing interface) pod or a FOUP (front opening unified pod). Each of the SMIF and the FOUP is a hermetically sealed container which houses therein a substrate cassette and is covered with a partition wall, and thus can keep independent internal environment isolated from an external space.

In the housing 10, there are provided a plurality of (four in this embodiment) polishing units 14a, 14b, 14c, 14d, a first cleaning unit 16 and a second cleaning unit 18 each for cleaning a substrate after polishing, and a drying unit 20 for drying a substrate after cleaning. The polishing units 14a, 14b, 14c, 14d are arranged in the longitudinal direction of the substrate processing apparatus, and the cleaning units 16, 18 and the drying unit 20 are also arranged in the longitudinal direction of the substrate processing apparatus. The substrate cleaning apparatus according to the embodiment of the present invention is applied to the second cleaning unit 18.

A first transfer robot 22 is disposed in an area surrounded by the loading port 12, and the polishing unit 14a and the drying unit 20 which are located near the loading port 12. Further, a substrate transport unit 24 is disposed in parallel to the polishing units 14a, 14b, 14c, 14d. The first transfer robot 22 receives a substrate before polishing from the loading port 12 and transfers the substrate to the transport unit 24, and receives a substrate after drying from the drying unit 20 and returns the substrate to the loading port 12. The transport unit 24 transports a substrate transferred from the first transfer robot 22, and transfers the substrate between the transport unit 24 and the polishing units 14a, 14b, 14c, 14d.

Between the first cleaning unit 16 and the second cleaning unit 18, there is provided a second transfer robot 26 for transferring a substrate between the first cleaning unit 16 and the second cleaning unit 18. Between the second cleaning unit 18 and the drying unit 20, there is provided a third transfer robot 28 for transferring a substrate between the second cleaning unit 18 and the drying unit 20. Further, in the housing 10, there is provided a control unit 30 for controlling operations of respective devices in the substrate processing apparatus.

In this example, a roll cleaning unit in which elongated cylindrical roll cleaning members extending horizontally are brought into contact with the front surface and the reverse surface of the substrate in the presence of a cleaning liquid and the substrate and the roll cleaning members are being rotated in respective directions to scrub-clean the front surface and the reverse surface of the substrate, is used as the first cleaning unit 16. The first cleaning unit (roll cleaning unit) 16 is configured to use a megasonic cleaning in which an ultrasonic wave is applied at a frequency of about 1 MHz to the cleaning liquid to vibrate the cleaning liquid and to apply a force generated due to the vibrational acceleration of the cleaning liquid to fine particles deposited on the surfaces of the substrate, in combination with the scrub cleaning.

The substrate cleaning apparatus according to the embodiment of the present invention is used as the second cleaning unit 18. Further, a spin drying unit in which an IPA vapor is ejected toward a substrate rotating horizontally from a moving injection nozzle to dry the substrate and the substrate is rotated at a high rotational speed to dry the substrate by a centrifugal force, is used as the drying unit 20.

Figure 2:
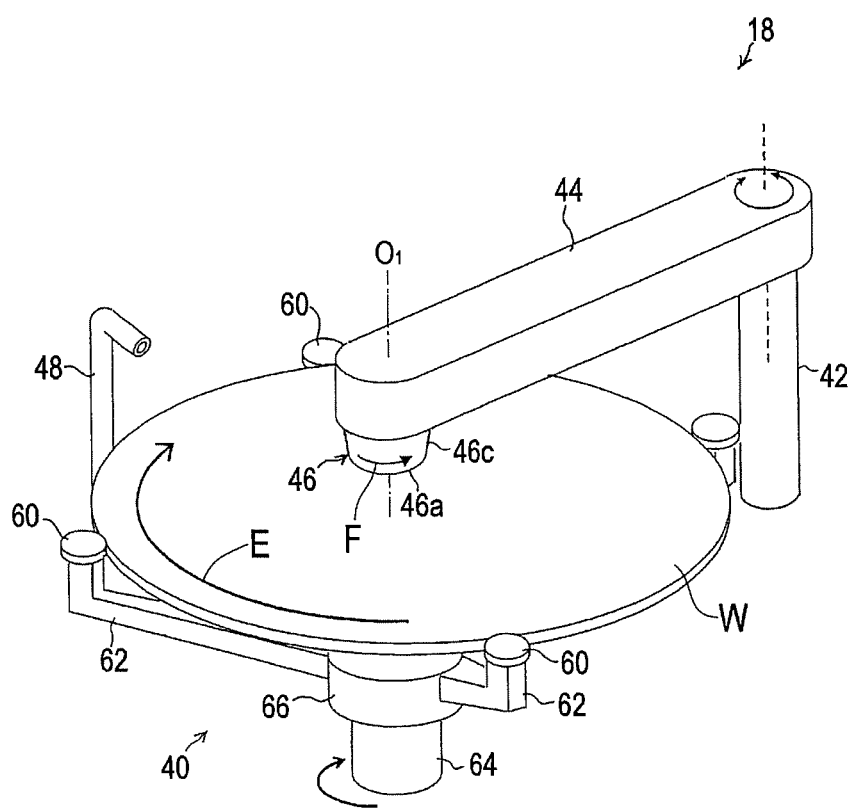
FIG. 2 is a schematic perspective view showing the substrate cleaning apparatus, according to an embodiment of the present invention, which is used as the second cleaning unit shown in FIG. 1.
Figure 3:
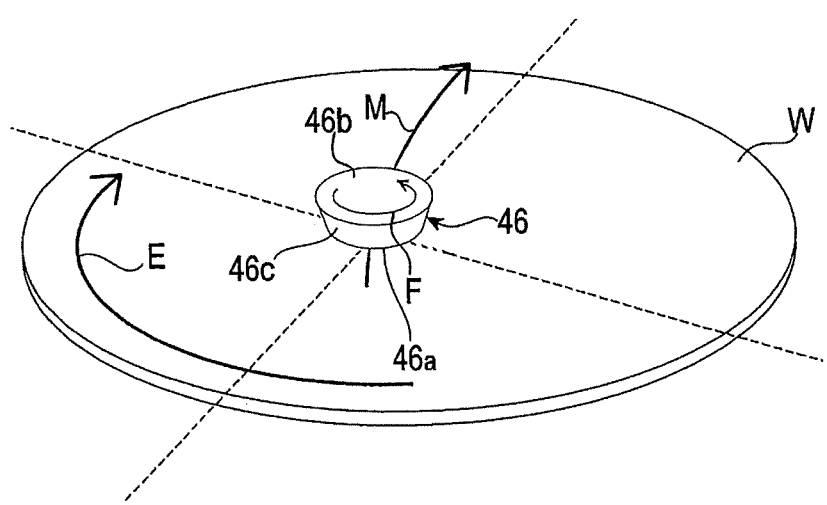
FIG. 3 is a perspective view showing the relationship between the substrate and the cleaning member in the second cleaning unit shown in FIG. 2.

FIG. 2 is a schematic perspective view showing the substrate cleaning apparatus, according to an embodiment of the present invention, which is used as the second cleaning unit 18 shown in FIG. 1. FIG. 3 is a perspective view showing the relationship between a substrate and a cleaning member in the cleaning unit 18 shown in FIG. 2.

As shown in FIGS. 2 and 3, the second cleaning unit 18 as the substrate cleaning apparatus according to the embodiment of the present invention comprises a substrate holding mechanism 40 for holding and rotating a substrate W such as a semiconductor wafer, a rotatable support shaft 42 disposed laterally of the substrate W that is held by the substrate holding mechanism 40, and a swing arm 44 having a proximal end connected to the upper end of the support shaft 42 and extending horizontally from the support shaft 42. A pencil-type cleaning member 46 made of PVA sponge, which is vertically movable and rotatable about a rotational axis $O_1$ extending in a substantially vertical direction, is attached to a free end (tip end) of the swing arm 44. The diameter of the pencil-type cleaning member 46 is set to be smaller than the diameter of the substrate W. Further, the second cleaning unit 18 has a cleaning liquid supply nozzle 48 positioned laterally and upwardly of the substrate W that is held by the substrate holding mechanism 40. The cleaning liquid supply nozzle 48 supplies a cleaning liquid to the surface (front surface) of the substrate W that is being rotated in a horizontal plane.

The substrate holding mechanism 40 has a plurality of (four in the illustrated embodiment) arms 62 having respective distal ends to which chucks 60 for holding the substrate W horizontally are attached. The arms 62 have respective proximal ends connected to a base 66 that rotates together with a rotational shaft 64. The substrate W that is held by the chucks 60 of the substrate holding mechanism 40 is rotated in the direction indicated by the arrow E (rotation direction E) when the rotational shaft 64 rotates about its own axis.

When the swing arm 44 is swung upon rotation of the support shaft 42, the pencil-type cleaning member 46 moves in a substantially radial direction of the substrate W from a substantially central position on the substrate W toward an outer circumferential edge of the substrate W as indicated by the arrow M in FIG. 3.

Figure 4:
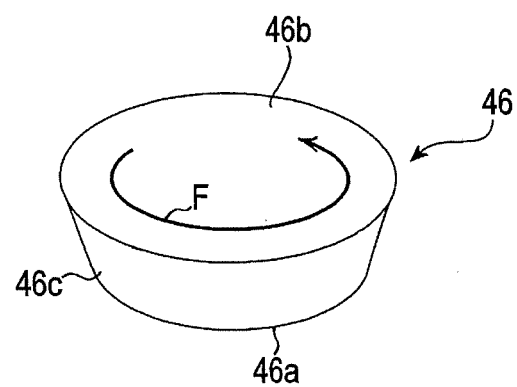
FIG. 4 is a perspective view of the cleaning member.
Figure 5:
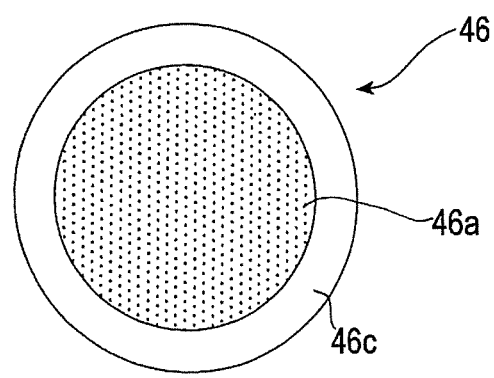
FIG. 5 is a bottom view of the cleaning member.
Figure 6:
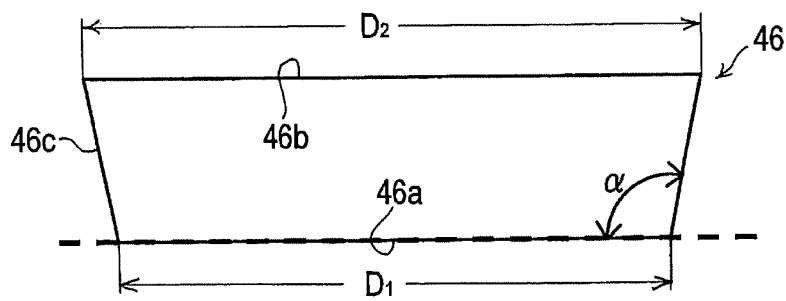
FIG. 6 is a vertical cross-sectional view of the cleaning member along a plane passing through the center thereof.

As shown in detail in FIGS. 4 through 6, the pencil-type cleaning member 46 has a lower-end contact surface 46a and an upper-end surface 46b. The area (diameter $D_2$) of the upper-end surface 46b is larger than the area (diameter $D_1$) of the lower-end contact surface 46a ($D_1<D_2$). FIG. 6 is a vertical cross-sectional view of the pencil-type cleaning member 46 along a plane passing through the center thereof. As shown in FIG. 6, the pencil-type cleaning member 46 has an inverted truncated-cone shape wherein the angle α between the lower-end contact surface 46a and a straight line (generatrix) on an outer circumferential surface 46c is larger than 90° and is not more than 150°, i.e., 90°<α≤150°. The angle α between the lower-end contact 46a and the straight line on the outer circumferential surface 46c should be preferably 90°<α≤120° and more preferably 95°<α≤120°.

A cleaning process of the substrate W performed by the second cleaning unit 81 will be described by way of example. As shown in FIG. 2, first, the substrate W is held horizontally by the chucks 60 of the substrate holding mechanism 40 and is rotated. The rotation direction E of the substrate W is a clockwise direction as shown in FIGS. 2 and 3. The cleaning liquid supply nozzle 48 supplies a cleaning liquid to the surface of the substrate W which is being rotated horizontally. At this time, the pencil-type cleaning member 46 is located in a cleaning start position A (see FIG. 13) above a position near the rotation center of the substrate W.

Then, the cleaning member 46 is lowered while the cleaning member 46 is being rotated in a rotation direction F (see FIGS. 2 and 3) which is opposite to the rotation direction E of the substrate W, and the lower-end contact surface 46a of the cleaning member 46 is brought into contact with the surface of the substrate W under a predetermined pressure. Then, while the lower-end contact surface 46a is being held in contact with the surface of the substrate W under the predetermined pressure, the swing arm 44 is driven to move the pencil-type cleaning member 46 in a moving direction M along a substantially radial direction of the substrate W shown in FIG. 3 to a cleaning end position located at the outer circumferential edge of the substrate W. Thus, the entire surface of the substrate W is scrub-cleaned by the cleaning member 46.

Figure 7A:
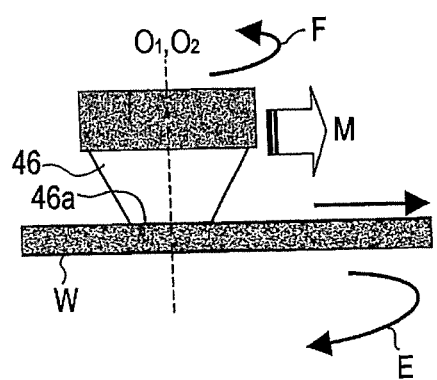
FIG. 7A is a view showing the manner in which the cleaning member is moved while the cleaning member is being rotated about its own axis in such a state that the rotational axis of the cleaning member is aligned with a vertical axis.
Figure 7B:
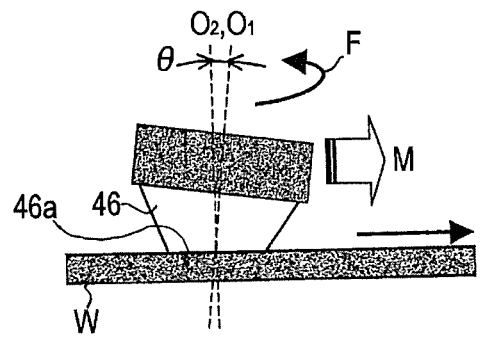
FIG. 7B is a view showing the manner in which the cleaning member is moved while the cleaning member is being rotated about its own axis in such a state that the rotational axis of the cleaning member is inclined in the same direction as the moving direction of the cleaning member.

As shown in FIG. 7A, the cleaning member 46 may be moved along the moving direction M toward the outer circumferential edge of the substrate W while the cleaning member 46 is being rotated about the rotational axis $O_1$, in such a state that the rotational axis $O_1$ of the cleaning member 46 is aligned with a vertical axis $O_2$. According to the present embodiment, as shown in FIG. 7B, the cleaning member 46 is moved along the moving direction M toward the outer circumferential edge of the substrate W while the cleaning member 46 is being rotated about the rotational axis $O_1$, in such a state that the rotational axis $O_1$ of the cleaning member 46 is inclined in the same direction as the moving direction of the cleaning member 46 by an angle α, i.e., the rotational axis $O_1$ of the cleaning member 46 is inclined with respect to the vertical axis $O_2$ by the angle α in the moving direction M. The inclination angle α is preferably in the range of 1° to 15°. If the inclination angle θ is too large, the cleaning liquid is hard to enter between the cleaning member 46 and the substrate W, and a pressure applied by the inclination of the cleaning member 46 to the substrate becomes large to cause an excessive deviation of the pressure distribution in a plane of the contact surface. In view of the above, the inclination angle α is set to be not less than 1° and not more than 15° (1°≤α≤15°). Here, the inclination angle α may be larger than 0° at which the rotational axis $O_1$ of the cleaning member 46 is not inclined, without limiting to not less than 1°.

At this time, as described above, the pencil-type cleaning member 46 having an inverted truncated-cone shape wherein the angle α between the lower-end contact surface 46a and the straight line on the outer circumferential surface 46c is 90°<α≤150° is used, as shown in FIG. 6, and thus a part of the lower-end contact surface 46a can be prevented from being lifted off the surface of the substrate W.

Figure 8A:
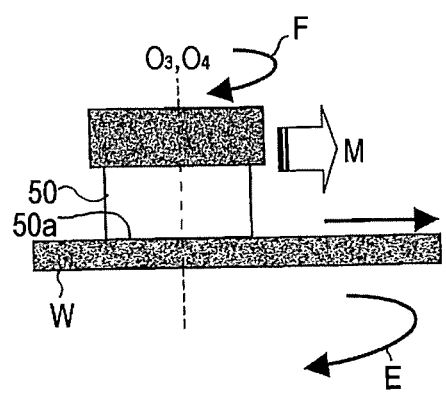
FIG. 8A is a view showing the manner in which a conventional general cylindrical cleaning member is moved while the cleaning member is being rotated about its own axis in such a state that the rotational axis of the cleaning member is aligned with a vertical axis.
Figure 8B:
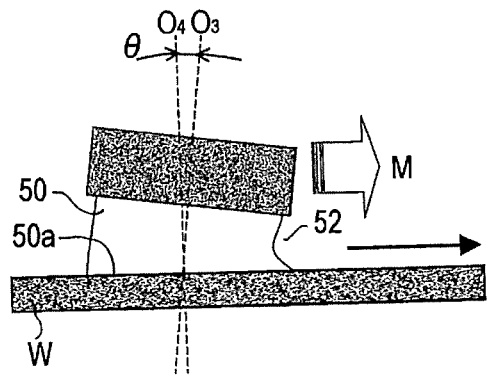
FIG. 8B is a view showing the manner in which the cleaning member is moved while the cleaning member is being rotated about its own axis in such a state that the rotational axis of the cleaning member is inclined in the same direction as the moving direction of the cleaning member.

Specifically, as shown in FIG. 8A, if a conventional general cylindrical cleaning member (hereinafter referred to as "comparative cleaning member") 50 is moved along the moving direction M toward the outer circumferential edge of the substrate W while the comparative cleaning member 50 is being rotated about an axis $O_3$ (rotational axis $O_3$) in such a state that the rotational axis $O_3$ is aligned with a vertical axis $O_4$, then any part of the lower-end contact surface 50a of the comparative cleaning member 50 can be prevented from being lifted off the surface of the substrate W. However, as shown in FIG. 8B, if the comparative cleaning member 50 is moved along the moving direction M toward the outer circumferential edge of the substrate W while the comparative cleaning member 50 is being rotated about the rotational axis $O_3$ in such a state that the rotational axis $O_3$ of the comparative cleaning member 50 is inclined by the angle α in the same direction as the moving direction M of the comparative cleaning member 50, then the comparative cleaning member 50 produces a dented region 52 caused by deflection in the outer circumferential surface located at the moving direction side of the comparative cleaning member 50, and a part of the lower-end contact surface 50a located below the dented region 52 tends to be lifted off the surface of the substrate W. In FIGS. 8A and 8B, the rotation direction F of the comparative cleaning member 50 is the same as the rotation direction E of the substrate W.

When a part of the lower-end contact surface 50a of the comparative cleaning member 50 tends to be lifted off the surface of the substrate W, particles (defects) are retained between the comparative cleaning member 50 and the substrate W, and are then discharged onto the substrate W outside of the comparative cleaning member 50 and are left on the substrate W.

Figure 9:
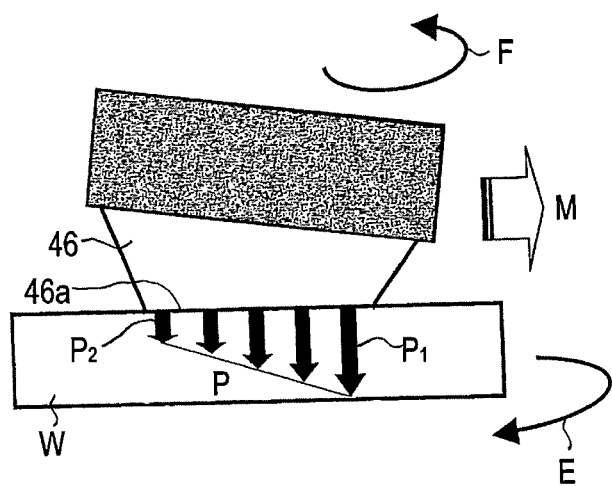
FIG. 9 is a view showing a distribution state of contact pressures of the cleaning member against the surface of the substrate in the state shown in FIG. 7B.

According to the present embodiment, because the cleaning member 46 is formed into an inverted truncated-cone shape, even if the cleaning member 46 is moved along the moving direction M toward the outer circumferential edge of the substrate W while the cleaning member 46 is being rotated about the rotational axis $O_1$ in such a state that the rotational axis $O_1$ of the cleaning member 46 is inclined by the angle α in the same direction as the moving direction M, a part of the lower-end contact surface 46a can be prevented from being lifted off the surface of the substrate W. In this case, as shown in FIG. 9, since the deformation amount (deflection amount) of the cleaning member 46 is progressively greater as the lower-end contact surface 46a is moving toward the forward side of the moving direction M, the contact pressure P of the cleaning member 46 against the surface of the substrate W is progressively greater toward the forward side of the moving direction M of the cleaning member 46.

Specifically, the contact pressure $P_1$ of the cleaning member 46 against the surface of the substrate W is relatively larger in a portion (right half in FIG. 9) of the cleaning member 46 which is closer to the outer circumferential edge of the substrate W, whereas the contact pressure $P_2$ of the cleaning member 46 against the surface of the substrate W is relatively smaller in a portion (left half in FIG. 9) of the cleaning member 46 which is closer to the center of the substrate W. In this manner, the contact pressure P of the cleaning member 46 against the surface of the substrate W is adjusted to efficiently clean a substantially entire area of the surface of the substrate W with a high degree of cleanliness even if the surface of the substrate W has a hydrophobic property.

Figure 10A:
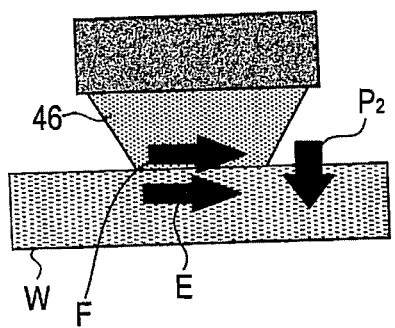
FIG. 10A is a view showing the relationship between the rotation direction of the substrate, the rotation direction of the cleaning member, and the contact pressure of the cleaning member against the surface of the substrate, in a left half (closer to the center of the substrate) of the cleaning member shown in FIG. 9.
Figure 10B:
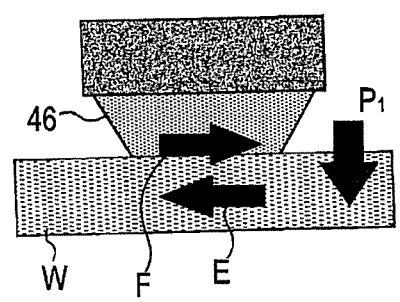
FIG. 10B is a view showing the relationship between the rotation direction of the substrate, the rotation direction of the cleaning member, and the contact pressure of the cleaning member against the surface of the substrate, in a right half (closer to the outer circumferential area of the substrate) of the cleaning member shown in FIG. 9.

As described above, in the portion (right half in FIG. 9) of the cleaning member 46 which is closer to the outer circumferential edge of the substrate W, the contact pressure $P_1$ of the cleaning member 46 against the surface of the substrate W is relatively larger, and the relative rotational speed between the substrate W and the cleaning member 46 is relatively higher, as shown in FIG. 10B, and thus the cleaning efficiency is increased in that portion of the cleaning member. In the portion (left half in FIG. 9) of the cleaning member 46 which is closer to the center of the substrate W, the contact pressure $P_2$ of the cleaning member 46 against the surface of the substrate W is relatively smaller, and the relative rotational speed between the substrate W and the cleaning member 46 is relatively lower, as shown in FIG. 10A, and thus any back contamination of the substrate W from the cleaning member 46 can be reduced in that portion of the cleaning member. Consequently, a high cleaning capability can be maintained to clean the substrate up to the outer circumferential edge of the substrate.

Figure 11:
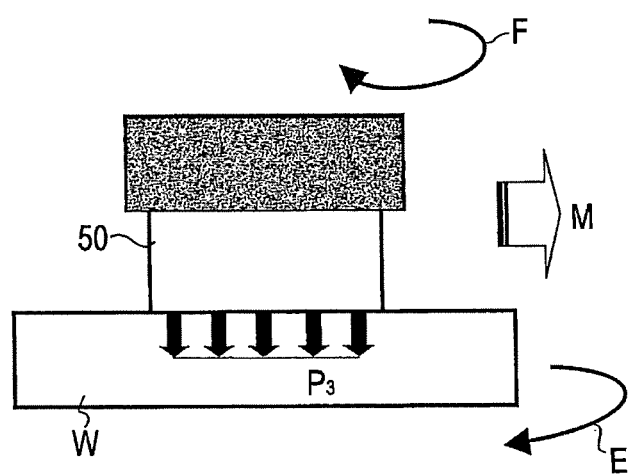
FIG. 11 is a view showing a distribution state of contact pressures of the cleaning member against the surface of the substrate in the state shown in FIG. 8A.

If the comparative cleaning member 50 is moved along the moving direction M toward the outer circumferential edge of the substrate W while the comparative cleaning member 50 is being rotated about the rotational axis $O_3$ in such a state that the rotational axis $O_3$ of the comparative cleaning member 50 is aligned with the vertical axis $O_4$, as shown in FIG. 11, then the deformation amount (deflection amount) of the comparative cleaning member 50 becomes substantially constant in the entire region of the comparative cleaning member 50, and the contact pressure $P_3$ of the comparative cleaning member 50 against the surface of the substrate W becomes substantially constant in the entire region of the comparative cleaning member 50. Consequently, the contact pressure $P_3$ of the comparative cleaning member 50 against the surface of the substrate W cannot be adjusted so as to be progressively greater along the moving direction M of the comparative cleaning member 50. It is thus difficult to efficiently clean a substantially entire region of the surface of the substrate W having a hydrophobic property, with a high degree of cleanliness.

Figure 12A:
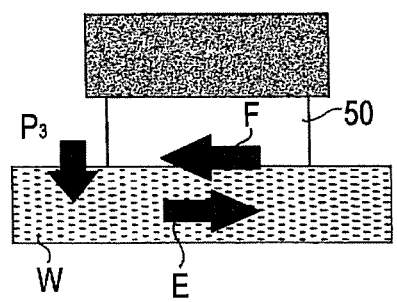
FIG. 12A is a view showing the relationship between the rotation direction of the substrate, the rotation direction of the cleaning member, and the contact pressure of the cleaning member against the surface of the substrate, in a left half (closer to the center of the substrate) of the cleaning member shown in FIG. 11.
Figure 12B:
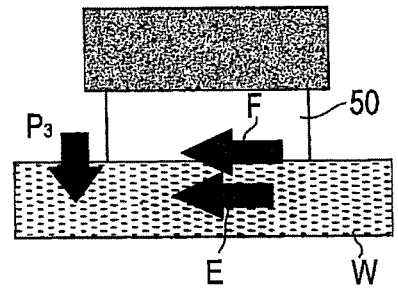
FIG. 12B is a view showing the relationship between the rotation direction of the substrate, the rotation direction of the cleaning member, and the contact pressure of the cleaning member against the surface of the substrate, in a right half (closer to the outer circumferential area of the substrate) of the cleaning member shown in FIG. 11.

Further, if the rotation direction E of the substrate W is the same as the rotation direction F of the comparative cleaning member 50, in the portion (left half in FIG. 11) of the comparative cleaning member 50 which is closer to the center of the substrate W, the rotation direction E of the substrate W and the rotation direction F of the comparative cleaning member 50 are opposite to each other, as shown in FIG. 12A, and the relative rotational speed between the substrate W and the comparative cleaning member 50 (the sum of their rotational speeds) becomes relatively high. On the other hand, in the portion (right half in FIG. 11) of the comparative cleaning member 50 which is closer to the outer circumferential edge of the substrate W, the rotation direction E of the substrate W and the rotation direction F of the comparative cleaning member 50 are the same, as shown in FIG. 12B, and the relative rotational speed between the substrate W and the comparative cleaning member 50 (the absolute value of the difference between their rotational speeds) becomes relatively low.

Accordingly, in the portion of the comparative cleaning member 50 which is closer to the center of the substrate W, a high cleaning capability can be achieved. However, in the portion of the comparative cleaning member 50 which is closer to the outer circumferential edge of the substrate W, a high cleaning capability cannot be achieved, thus causing back contamination of the substrate W from the comparative cleaning member 50 and lowering the cleanliness level at the outer circumferential portion of the substrate W.

In the present embodiment, the substrate W and the cleaning member 46 are rotated in the opposite directions. However, the substrate W and the cleaning member 46 may be rotated in the same direction.

Figure 13:
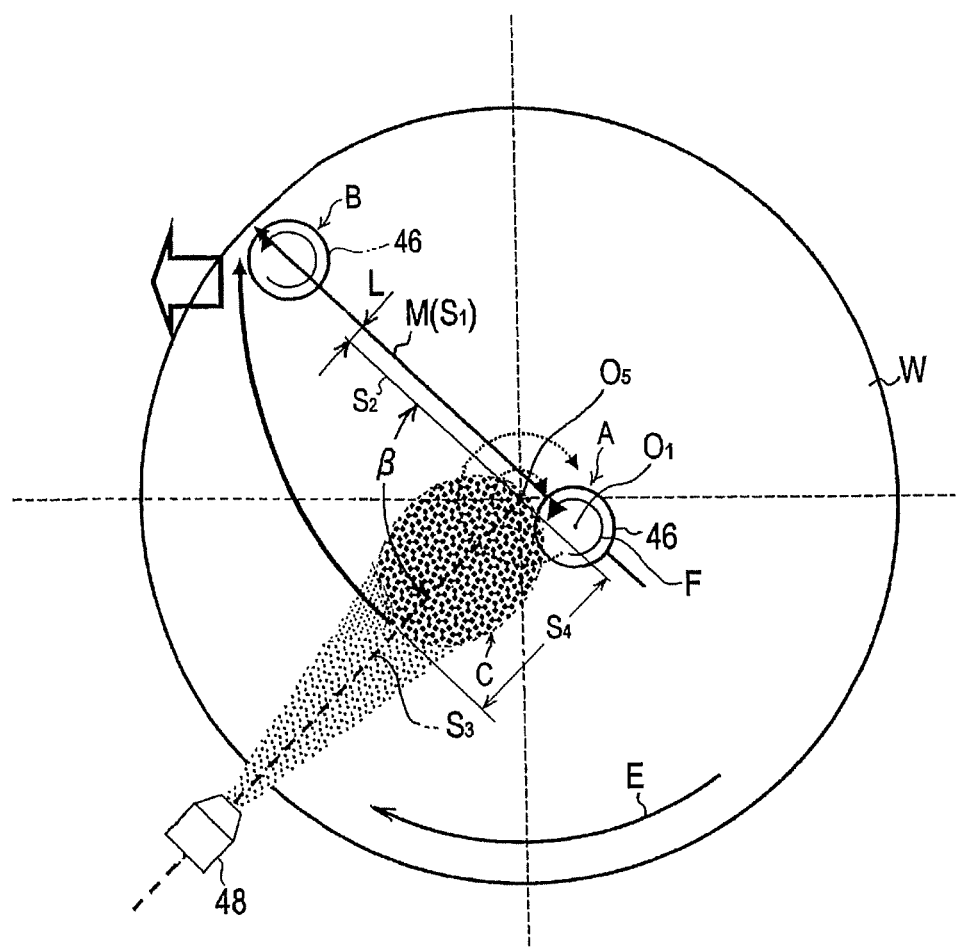
FIG. 13 is a plan view showing the positional relationship between the substrate, the cleaning member, and a cleaning liquid supply nozzle.

As shown in FIG. 13, the cleaning start position A of the cleaning member 46 is set at a position that is behind the rotation center $O_5$ of the substrate W along the moving direction M, so that the cleaning member 46 passes over the vicinity of the rotation center $O_5$ reliably when the cleaning member 46 moves along the moving direction M along a substantially radial direction of the substrate W. In other words, when the cleaning member 46 is located at the cleaning start position A, the lower-end contact surface 46a of the cleaning member 46 does not touch the rotation center $O_5$ of the substrate W, and when the cleaning member 46 moves along the moving direction M, the lower-end contact surface 46a passes over the rotation center $O_5$.

The cleaning start position A may be set at the vicinity of the outer circumferential edge of the substrate W, and the cleaning member 46 may be moved over a substantially entire length of a diameter of the substrate W, and the lower-end contact surface 46a may pass over the rotation center $O_5$ of the substrate W in the middle of its movement.

Further, the distance L between a straight line $S_1$ that extends through the rotational axis $O_1$ of the cleaning member 46 and along the moving direction M of the cleaning member 46 and a straight line $S_2$ that extends through the rotation center $O_5$ of the substrate W and in parallel to the straight line $S_1$ is set to a value that is greater than 0 and smaller than the radius R ($=D_1/2$) of the lower-end contact surface 46a of the cleaning member 46 ($0<L<D_1/2$).

With the distance L being thus set, the cleaning member 46 is capable of reliably cleaning a non-rotating region of the substrate W at the rotation center $O_5$ of the substrate W by allowing the lower-end contact surface 46a of the cleaning member 46 to pass over the rotation center $O_5$ and by allowing the rotational axis $O_1$ of the cleaning member 46 not to pass over the rotation center $O_5$.

The cleaning liquid supply nozzle 48 comprises a conical nozzle for distributing the cleaning liquid in an elliptical pattern over the substrate W, rather than a cleaning nozzle for distributing the cleaning liquid in an elongated rectangular pattern over the substrate W. The cleaning liquid supply nozzle 48 is arranged such that the cleaning liquid ejected therefrom will reach a region of the substrate W in the vicinity of the rotation center $O_5$ of the substrate W directly or by a stream of the cleaning liquid. The cleaning liquid supply nozzle 48 is disposed in such a position that the ejection direction of the cleaning liquid supply nozzle 48, i.e., the angle β between the straight line $S_2$ and a straight line $S_3$ which interconnects the cleaning liquid supply nozzle 48 and the rotation center $O_5$ of the substrate W, is in the range of 60° to 120° (60°≤β<120°). With this arrangement of the cleaning liquid supply nozzle 48, a large amount of fresh cleaning liquid can be supplied in an area where the pencil-type cleaning member 46 is operated.

Here, a conical nozzle is used as the chemical liquid supply nozzle, and the cleaning liquid is distributed in an elliptical pattern. However, the shape of the nozzle and the distribution pattern of the cleaning liquid are not to the above.

The cleaning liquid supplied to the surface of the substrate W starts to move radially outwardly, simultaneously with the contact of the cleaning liquid with the surface of the substrate W under centrifugal forces generated when the substrate W is rotated in a horizontal plane, and spreads over the entire surface of the substrate W. Since the angle β of the cleaning liquid supply nozzle 48 with respect to the moving direction M of the cleaning member 46 is in the range of 60° to 120°, it is possible to supply a large amount of fresh cleaning liquid to the lower-end contact surface 46a of the cleaning member 46.

The contact area C where the cleaning liquid supplied from the cleaning liquid supply nozzle 48 is brought into with the surface of the substrate W has an outermost position closer to the outer circumferential edge of the substrate W. The outermost position of the contact area C is spaced from the rotation center $O_5$ of the substrate W by a distance $S_4$ which should preferably be at least ⅓ of the radius of the substrate W. When the substrate W is rotated in such a state that the cleaning liquid is held in contact with the substrate W, the cleaning liquid spreads uniformly over the surface of the substrate W by the centrifugal forces. The cleaning liquid that is positioned at the outermost position of the contact area C should be preferably discharged to the outer circumferential area of the substrate W before the cleaning liquid reaches an outermost circumferential position B of the cleaning member 46 when the cleaning member 46 is carried toward the outer circumferential area of the substrate W under centrifugal forces. If the surface of the substrate W is hydrophobic (contact angle ≥60°), the rotational speed of the substrate W is set to 200 rpm or higher.

When the substrate is scrub-cleaned by a cleaning member that is rubbed against the substrate in the presence of a cleaning liquid, the total cleaning characteristic of the cleaning process is represented by the sum of a removal cleaning characteristic to remove particles and the like using the cleaning liquid and a contact cleaning characteristic that is provided by physical contact between the cleaning member and the substrate. According to the present embodiment, a large amount of fresh cleaning liquid is supplied to the lower-end contact surface 46a of the cleaning member 46 to provide a high cleaning characteristic and increase the efficiency in the use of the cleaning liquid.

In the substrate processing apparatus shown in FIG. 1, the substrate taken out from a substrate cassette inside the loading port 12 is transferred to one of the polishing units 14a, 14b, 14c, 14d, and the surface of the substrate is polished by the specified polishing unit. The surface of the substrate which has been polished is roughly cleaned in the first cleaning unit (roll cleaning unit) 16, and is then finally cleaned in the second cleaning unit (substrate cleaning apparatus) 18. Then, the cleaned substrate is removed from the second cleaning unit 18 and transferred to the drying unit 20 where the substrate is dried. Thereafter, the dried substrate is returned into the substrate cassette inside the loading port 12.

The total cleaning capability of the contact cleaning is represented by the sum of a contamination of the substrate caused by contact with the cleaning member and the cleaning characteristic. In order to evaluate the contamination of the substrate caused by contact with the cleaning member, a surface of a sample substrate which has a hydrophilic surface property was cleaned using the second cleaning unit (substrate cleaning apparatus) 18 shown in FIG. 2, and the cleaned sample substrate was spin-dried. Thereafter, the number of particles (defects) having a size of 42 nm or greater that remained on the surface of the sample substrate was measured. The measured result is shown as Inventive Example 1 in FIG. 14. Similarly, a surface of a sample substrate which has a hydrophobic surface property was cleaned using the second cleaning unit (substrate cleaning apparatus) 18 shown in FIG. 2, and the cleaned sample substrate was dried with IPA (Iso-Propyl Alcohol). Thereafter, the number of particles (defects) having a size of 42 nm or greater that remained on the surface of the sample substrate was measured. The measured result is shown as Inventive Example 2 in FIG. 14.

A surface of a sample substrate which has a hydrophilic surface property was cleaned using a general conventional cleaning unit. The cleaned sample substrate was spin-dried and the number of particles (defects) having a size of 42 nm or greater was measured in the same manner as the Inventive Example 1. The measured result is shown as Comparative Example 1 in FIG. 14. A surface of a sample substrate which has a hydrophobic surface property was cleaned using a general conventional cleaning unit. The cleaned sample substrate was spin-dried and the number of particles (defects) having a size of 42 nm or greater was measured as with Comparative Example 1. The measured result is shown as Comparative Example 2 in FIG. 14.

Figure 14:
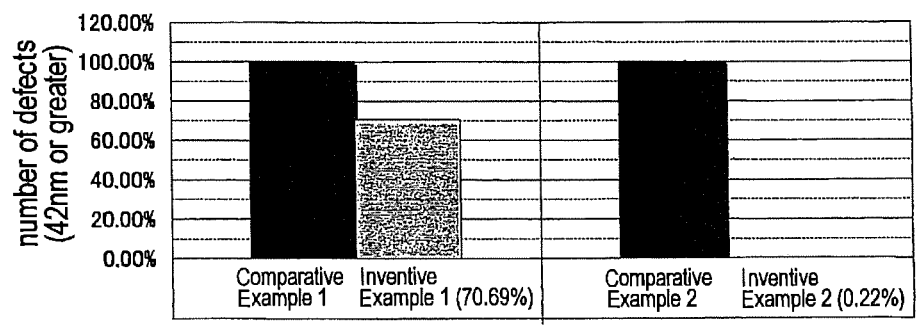
FIG. 14 is a graph showing the measured results of the numbers of defects remaining on sample surfaces according to Inventive Examples 1, 2 and Comparative Examples 1, 2.

In FIG. 14, the number of defects in each of Comparative Examples 1, 2 is indicated as 100%, and the number of defects in each of Inventive Examples 1, 2 is indicated as a percentage with respect to Comparative Examples 1, 2. The same holds true for FIG. 15.

It is understood from FIG. 14 that the number of defects having a size of 42 nm or greater that remained on the surface of the sample substrate after cleaning is much smaller in Inventive Examples 1, 2 than in Comparative Examples 1, 2 (70.69% on the hydrophilic surface and 0.22% on the hydrophobic surface), thus preventing the substrate from being back-contaminated. It is understood that this effect is prominent in the case where the surface of the substrate is hydrophobic.

A surface (low-k film) of a sample substrate which includes a low-k film (k=2.4) having a hydrophobic surface property was polished by a polishing unit, and the polished surface of the sample substrate was cleaned using the second cleaning unit (substrate cleaning apparatus) 18 shown in FIG. 2. After the cleaned sample substrate was dried with IPA (Iso-Propyl alcohol), the number of particles (defects) having a size of 100 nm or greater that remained on the surface of the sample substrate was measured. The measured result is shown as Inventive Example 3 in FIG. 15. A surface of a sample substrate which includes a low-k film was polished, and the polished surface of the sample substrate was cleaned using a general conventional cleaning unit. The cleaned sample substrate was dried with IPA (Iso-Propyl alcohol) and the number of particles (defects) having a size of 100 nm or greater was measured as with Inventive Example 3. The measured result is shown as Comparative Example 3 in FIG. 15.

Figure 15:
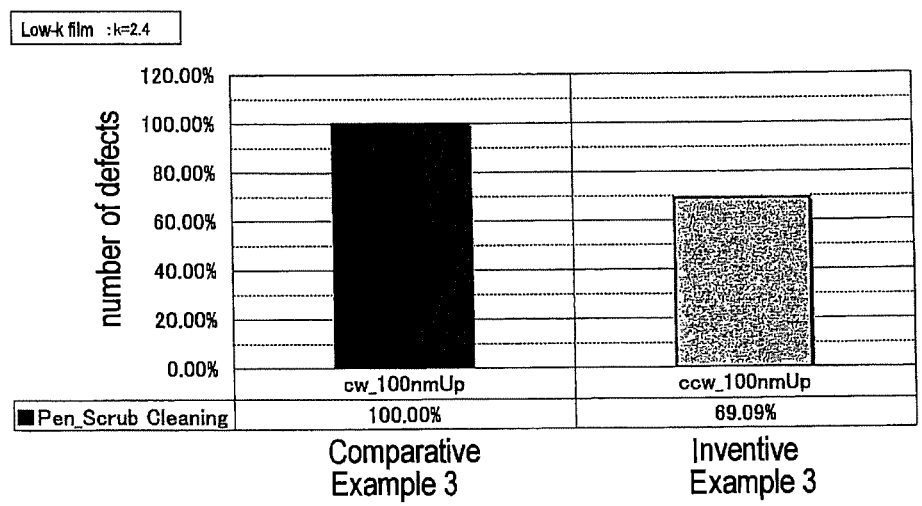
FIG. 15 is a graph showing the measured results of the numbers of defects remaining on sample surfaces according to Inventive Example 3 and Comparative Example 3.

It is understood from FIG. 15 that the number of defects having a size of 100 nm or greater that remained on the surface of the sample substrate after cleaning is much smaller in Inventive Example 3 than in Comparative Example 3 (reduction of about 30%).

According to the present invention, even if the surface of the substrate to be cleaned is hydrophobic, the surface of the substrate can be cleaned with a high degree of cleanliness. Specifically, even in the surface of the substrate which has formed damascene interconnects using copper as an interconnect metal and a low-k film as an insulating film, and which has the exposed copper and the exposed low-k film, by CMP, that are hydrophobic, the surface of the substrate can be cleaned with a high degree of cleanliness to reduce the number of defects remaining on the surface of the substrate.

Although preferred embodiments have been described in detail above, it should be understood that the present invention is not limited to the illustrated embodiments, but many changes and modifications can be made therein without departing from the appended claims.

What is claimed is:

1. A substrate cleaning apparatus for cleaning a surface of a substrate, comprising:
    a substrate holding mechanism configured to hold and rotate the substrate;
    a cleaning member having a lower-end contact surface;
    a member configured to hold the cleaning member and move the cleaning member in one direction while said cleaning member is being rotated about a vertically extending rotational axis; and
    a cleaning liquid supply nozzle configured to supply a cleaning liquid to the surface of the substrate;
    wherein said cleaning member is configured to scrub-clean the surface of the substrate by rubbing said lower-end contact surface of said cleaning member against the surface of the substrate which is being rotated by the substrate holding mechanism in a horizontal plane in the presence of the cleaning liquid;
    said cleaning member has an inverted truncated-cone shape wherein the angle α between said lower-end contact surface and a straight line on an outer circumferential surface of said cleaning member is larger than 90° and is not more than 150°; and
    said cleaning member is moved in said one direction while the rotational axis of said cleaning member is inclined in the same direction as the moving direction of said cleaning member.

2. The substrate cleaning apparatus according to claim 1, wherein said cleaning member is rotated in a direction opposite to the rotation direction of the substrate.

3. The substrate cleaning apparatus according to claim 1, wherein said cleaning member is moved in said one direction so that said lower-end contact surface of said cleaning member passes over a rotation center of the substrate and the rotational axis of said cleaning member does not pass over the rotation center of the substrate.

4. A substrate cleaning method for cleaning a surface of a substrate, comprising:
    moving a cleaning member in one direction while said cleaning member is being rotated about a vertically extending rotational axis, and rubbing a lower-end contact surface of said cleaning member against the surface of the substrate which is being rotated in a horizontal plane in the presence of a cleaning liquid, thereby scrub-cleaning the surface of the substrate;
    wherein said cleaning member has an inverted truncated-cone shape wherein the angle α between said lower-end contact surface and a straight line on an outer circumferential surface of said cleaning member is larger than 90° and is not more than 150°; and
    wherein said cleaning member is moved in said one direction while the rotational axis of said cleaning member is inclined in the same direction as the moving direction of said cleaning member.

5. The substrate cleaning method according to claim 4, wherein said cleaning member is rotated in a direction opposite to the rotation direction of the substrate.

6. The substrate cleaning method according to claim 4, wherein said cleaning member is moved in said one direction so that said lower-end contact surface of said cleaning member passes over a rotation center of the substrate and the rotational axis of said cleaning member does not pass over the rotation center of the substrate.

7. A substrate cleaning apparatus for cleaning a surface of a substrate, comprising:
    a shaft for rotating the substrate about a rotational axis in a rotational direction;
    a movable arm having a proximal end movable in a first direction;
    a cleaning member rotationally coupled to the proximal end of the movable arm and configured to rotate about a rotational axis in a direction opposite the first rotational direction, the cleaning member having a lower-end contact surface, the cleaning member having a cone shape wherein an angle α between the lower-end contact surface and a straight line on an outer circumferential surface of the cleaning member is larger than 90° and is not more than 150°; and
    a cleaning liquid supply nozzle configured to supply a cleaning liquid to the surface of the substrate;
    the movable arm being configured to move the proximal end and thereby the rotationally coupled cleaning member in the first direction, wherein the substrate cleaning apparatus, when operational, rotates the cleaning member about the rotational axis and moves the lower-end contact surface of the cleaning member against the surface of the rotating substrate in the presence of the cleaning liquid, causing the rotational axis of the cleaning member to inclined in the same direction as the first direction.

8. The substrate cleaning apparatus according to claim 7, wherein the cleaning member is rotatable in a direction opposite to the rotation direction of the substrate.

9. The substrate cleaning apparatus according to claim 7, wherein the cleaning member is movable in one direction so that said lower-end contact surface of the cleaning member passes over a rotation center of the substrate and the rotational axis of the cleaning member does not pass over the rotation center of the substrate.

10. The substrate cleaning apparatus as recited in claim 7 wherein the substrate is a semiconductor substrate.

11. The substrate cleaning apparatus as recited in claim 7 wherein the substrate is a semiconductor substrate.

12. The substrate cleaning apparatus as recited in claim 7 wherein the rotational axis of the cleaning member is caused to be inclined in a range between 1 and 15 degrees.

13. The substrate cleaning apparatus as recited in claim 7 applies a contact pressure the wherein the moveable arm applies a contact pressure to the cleaning member when operational that causes the contact pressure of the cleaning surface to be greater on a portion of the cleaning surface that moves toward an outer circumference of the substrate compared to a portion of the cleaning member closer to the center of the substrate.

* * * * *